(12) United States Patent
Jeffery et al.

(10) Patent No.: US 6,362,644 B1
(45) Date of Patent: Mar. 26, 2002

(54) PROGRAMMABLE TERMINATION FOR INTEGRATED CIRCUITS

(75) Inventors: Philip A. Jeffery, Tempe; Stephen G. Shook, Gilbert, both of AZ (US)

(73) Assignee: Semiconductor Components Industries LLC, Phoenix, AZ (US)

( * ) Notice: Subject to any disclaimer, the term of this patent is extended or adjusted under 35 U.S.C. 154(b) by 0 days.

(21) Appl. No.: 09/630,090

(22) Filed: Aug. 1, 2000

(51) Int. Cl.$^7$ ............................................. H03K 17/16
(52) U.S. Cl. ........................................ 326/30; 326/101
(58) Field of Search .............................. 326/30, 62, 63, 326/101; 327/333, 564, 565

(56) References Cited

U.S. PATENT DOCUMENTS

| | | | | |
|---|---|---|---|---|
| 5,341,039 A | * | 8/1994 | Fukumoto | 326/30 |
| 5,374,861 A | * | 12/1994 | Kubista | 326/30 |
| 5,731,711 A | * | 3/1998 | Gabara | 326/30 |
| 5,781,028 A | * | 7/1998 | Decuir | 326/30 |
| 6,114,898 A | * | 9/2000 | Okayasu | 327/437 |

* cited by examiner

Primary Examiner—Tuan T. Lam

(57) ABSTRACT

A receiver circuit (16) is programmable to operate with different logic family driver circuits (10). The receiver circuit has two external configuration pins (22,) 24) that are configured to provide the necessary termination for the type of logic family driver circuit used. To terminate the receiver circuit (16) for an ECL application will require first and second configuration pins (22,24) are connected to $V_{CC}$—2 volts. To terminate the receiver circuit (16) for a CML application will require the first configuration pin (22) and the second configuration pin (24) are connected to $V_{CC}$. LVDS termination for the receiver circuit (16) requires the first configuration pin (22) and the second configuration pin (24) are connected together. The configuration pins are external to a semiconductor package (14) housing the receiver circuit.

16 Claims, 3 Drawing Sheets

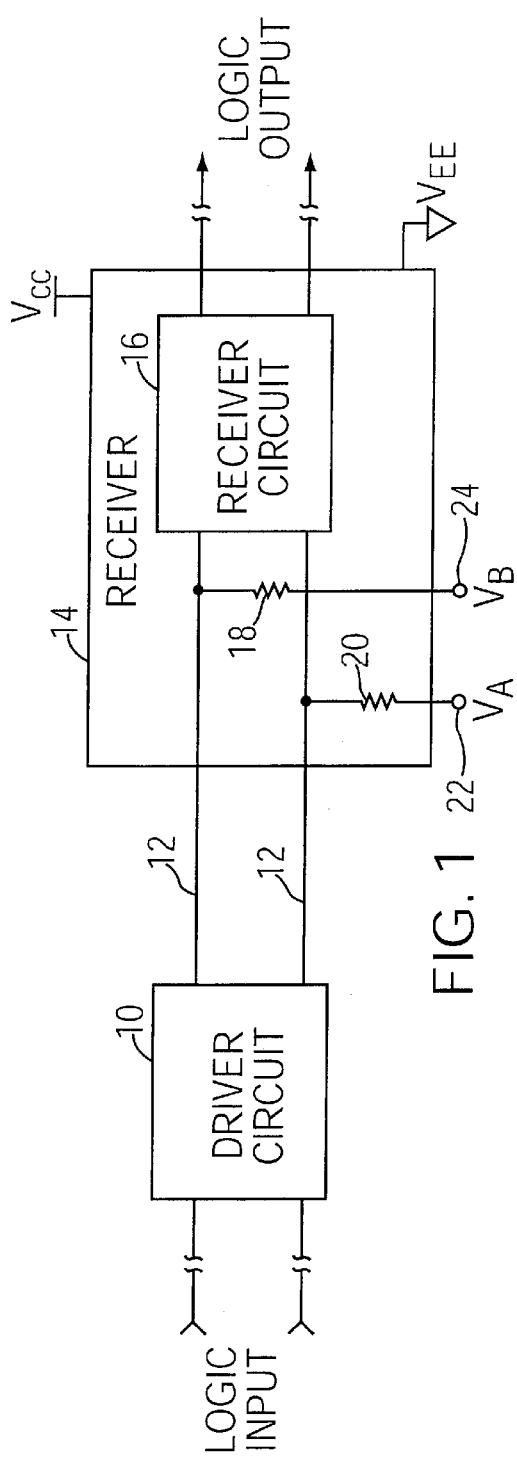
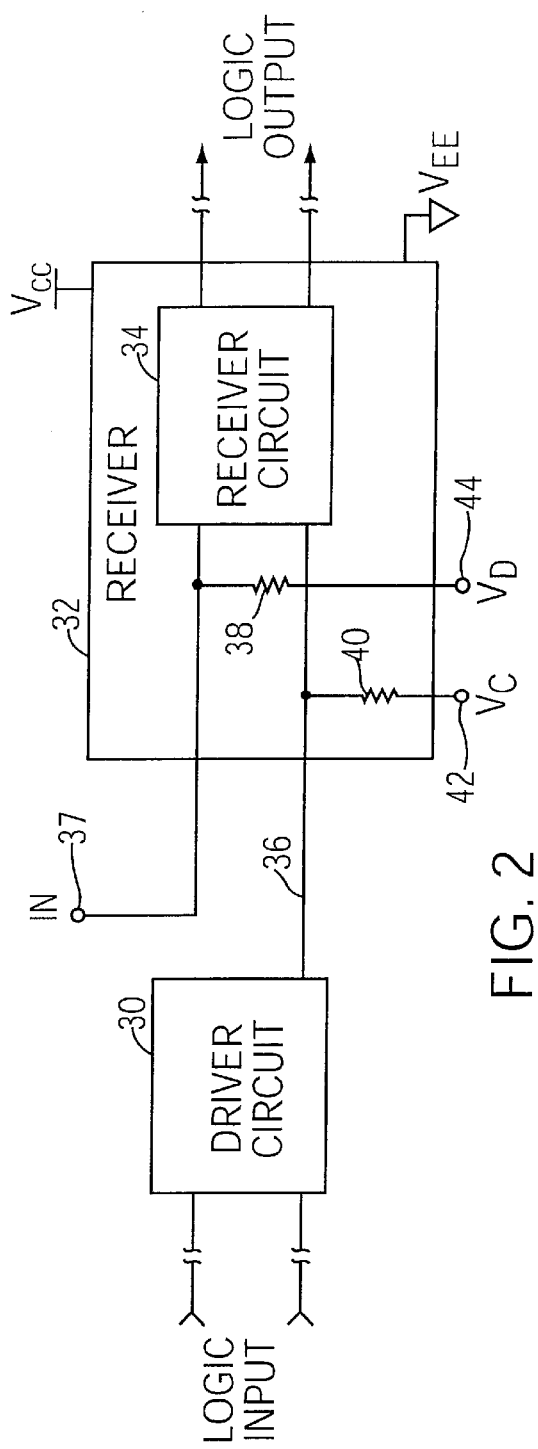
FIG. 1
FIG. 2

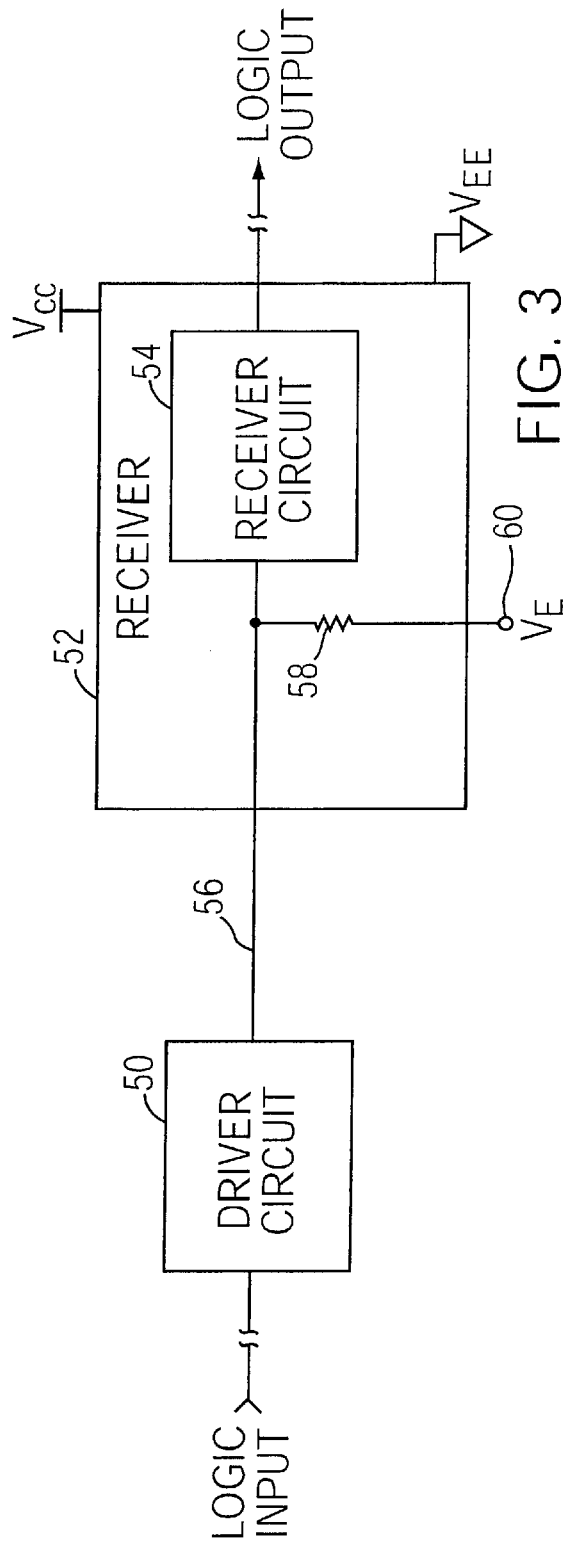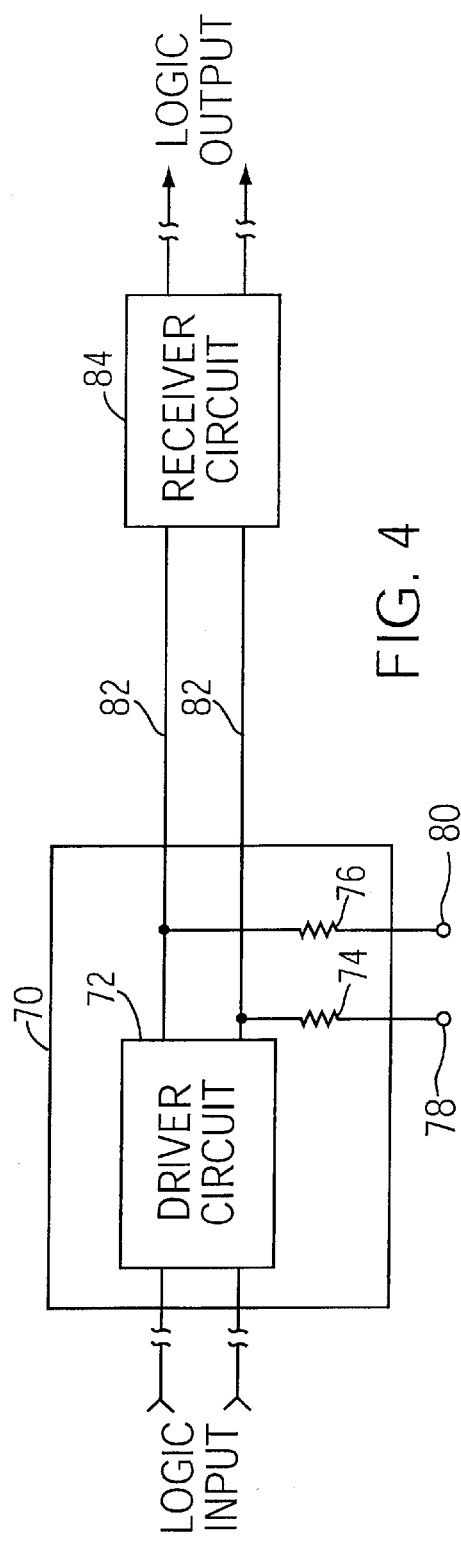

PROGRAMMABLE TERMINATION FOR INTEGRATED CIRCUITS

BACKGROUND OF THE INVENTION

The present invention relates in general to electronic circuits and, more particularly, to logic circuits.

Many logic family applications have logic devices that operate within a mixed signal environment. The logic devices have logic drivers that may communicate with a logic receiver of a different logic family type. Typically, different logic family devices communicate with each other using translators to convert, for example, an ECL signal from the logic driver to a CMOS signal received at the logic receiver. A different type of translator is required for each type of logic driver and logic receiver used within the mixed signal environment. In addition, systems usually have an external termination scheme on an interconnect transmission line between the logic driver and logic receiver so the logic receiver circuit is terminated to receive the specific logic driver family type. The termination is a resistance that provides a termination for the logic device through to a voltage source Vtt. The voltage source Vtt is typically different for each logic family application. The resistance is typically chosen to equal the impedance of the interconnect transmission line to help reduce interconnect signal distortion. It is more of an advantage to have terminations as close as possible to the logic receiver circuit to help reduce interconnect signal distortion even more. Also, prior art termination schemes typically require different termination connections are used for each type of logic family device. For example, to use an ECL logic device requires a 50 ohm termination to a Vtt voltage source. A CML logic device may require termination through a resistance to a different voltage source. Most prior art logic family devices also have the termination resistors hard-wired to a circuit board making it difficult to change terminations for different logic family applications.

Hence, it is desired to have a logic receiver circuit that is programmable to allow the logic receiver circuit to communicate with different logic family driver circuits. Furthermore, it is desirable to have the terminations internal to the logic receiver circuit package so the terminations are close to the receiving circuit to help eliminate transmitted signal noise. The invention disclosed herein will address the above problems.

BRIEF DESCRIPTION OF THE DRAWINGS

FIG. 1 is a schematic diagram of a driver and receiver circuit in a differential configuration;

FIG. 2 is a schematic diagram of a driver and receiver circuit in a single-ended configuration;

FIG. 3 is a schematic diagram of a driver and receiver circuit in a modified single-ended configuration;

FIG. 4 is a schematic diagram of a driver and receiver circuit in a differential configuration with driver circuit terminations.

DETAILED DESCRIPTION OF THE PREFERED EMBODIMENT

Figure 5:
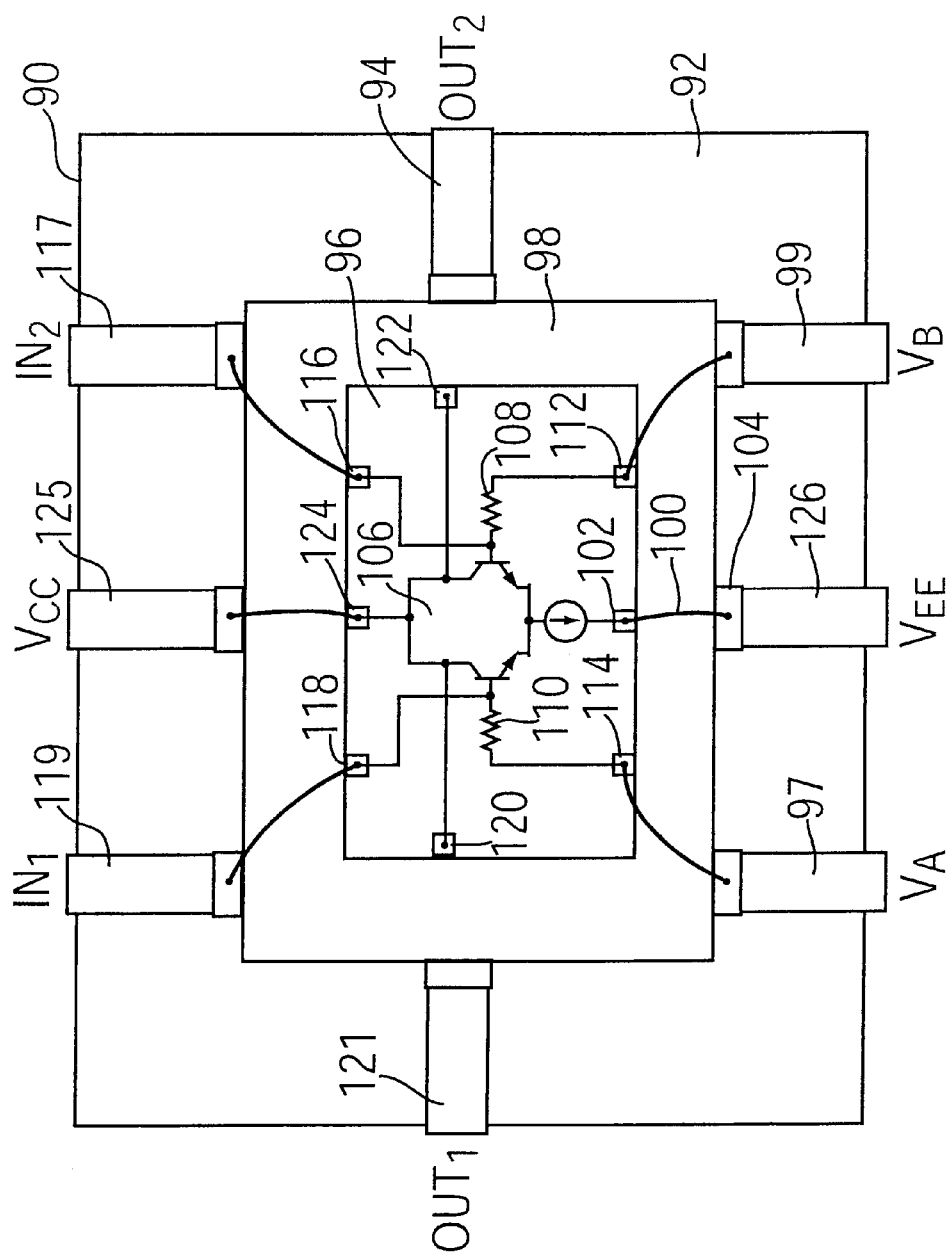
FIG. 5 is a schematic diagram of a receiver circuit showing semiconductor and package connections.

FIG. 1 illustrates an embodiment of a driver circuit and a receiver circuit system used in a differential configuration. The differential configuration receives a logic input signal at driver circuit 10. Driver circuit 10 is a device from a typical logic family, e.g. ECL, CML, LVDS, CMOS, and TTL, or can be an analog driver circuit. The primary purpose of driver circuit 10 is to provide a signal boost for the logic input signal. At the output to driver circuit 10 is differential line 12 which transmits a differential signal from driver circuit 10 to receiver package 14. Receiver package 14 is a semiconductor package housing receiver circuit 16. $V_{CC}$ and $V_{EE}$ are power supply potentials to receiver package 14 providing power to receiver circuit 16. Receiver circuit 16 receives a differential input signal on differential line 12 and provides a logic output signal. Receiver circuit 16 is typically a differential receiver circuit amplifier manufactured as a semiconductor die. Receiver circuit 16 and receiver package 14 are an integrated receiver circuit.

Differential line 12 is terminated with load element 18 and load element 20. Load element 18 is connected to configuration pin 24 and load element 20 is connected to configuration pin 22. Load elements 18, 20 are resistors contained within receiver package 14 having a resistance of 50, 75, or 100 ohms. Configuration pins 22, 24 are external pins connected to receiver package 14 and are programmable so receiver circuit 16 can communicate with different logic family drivers. To program configuration pins 22, 24, the pins are terminated using a configuration which is dependent on the desired logic family application. The configuration of receiver circuit 16 is controlled by connecting configuration pin 22 ($V_A$) and configuration pin 24 ($V_B$) as follows.

| ECL: | $V_A = V_B = V_{cc} - 2$ volts |
| CML: | $V_A = V_B = V_{CC}$ |
| LVDS: | $V_A$ connected to $V_B$ |

For example, to terminate receiver circuit 16 for an ECL application requires configuration pin 22 ($V_A$) and configuration pin 24 ($V_B$) are connected to receive configuration signal, $V_{CC}-2$ volts. To terminate receiver circuit 16 for an CML application requires configuration pin 22 ($V_A$) and configuration pin 24 ($V_B$) are connected to to receive configuration signal, $V_{CC}$. LVDS termination for receiver circuit 16 requires configuration pin 22 ($V_A$) and configuration pin 24 ($V_B$) are connected together. Termination of the configuration pins 22, 24 is done external to receiver package 14.

FIG. 2 illustrates an embodiment of a driver circuit and a receiver circuit system used in a single-ended configuration. The single-ended configuration receives a logic input signal at driver circuit 30. Driver circuit 30 is a device from a typical logic family, e.g. ECL, CML, LVDS, CMOS, and TTL, or can be an analog driver circuit. Driver circuit 30 provides a signal boost for the logic input signal. Line 36 is connected to the output of driver circuit 30 to transmit a signal from driver circuit 30 to receiver package 32. Receiver package 32 is a semiconductor package for receiver circuit 34. $V_{CC}$ and $V_{EE}$ are power supply potentials to receiver package 32 providing power to receiver circuit 34. Receiver circuit 30 is typically a differential receiver circuit amplifier manufactured as a semiconductor die. Receiver circuit 30 and receiver package 32 are an integrated receiver circuit.

Receiver circuit 34 receives two input signals: an information signal from driver circuit 30 on terminal 36, and control signal IN on terminal 37. Receiver circuit 34 is terminated at terminal 36 with load element 40, and at terminal 37 with load element 38. Load element 38 is connected to configuration pin 44 and load element 40 is connected to configuration pin 42. Load elements 38, 40 are resistors contained within receiver package 32 having a resistance of 50, 75, or 100 ohms. Configuration pins 42, 44 are external pins connected to receiver package 32 and are programmable so receiver circuit 34 can communicate with different logic family drivers. Configuration pins 42, 44 are programmed by terminating the pins using a configuration which is dependent on the desired logic family application. The configuration of receiver circuit 34 is controlled by connecting configuration pin 42 ($V_C$) and configuration pin 44 ($V_D$) as follows.

| ECL: | $V_C$ = $V_{CC}$ - 2 volts |
| --- | --- |
|  | $V_D$ = open |
|  | IN = $V_{BB}$ |
| CMOS: | $V_C$ = open |
|  | $V_D$ = open |
|  | IN = $V_{CC}$/2 |
| TTL: | $V_C$ = open |
|  | $V_D$ = open |
|  | IN = 1.5 volts |

$V_{BB}$ is typically the middle of an output swing to an ECL output. To terminate receiver circuit 34 for an ECL application requires configuration pin 42 ($V_C$) is connected to receive configuration signal, $V_{CC}$-2, configuration pin 44 ($V_D$) is devoid of a configuration signal, i.e. is left open, and terminal 37 is connected to receive control signal, $V_{BB}$. To terminate receiver circuit 34 for a CMOS application requires configuration pin 42 ($V_C$) and configuration pin 44 ($V_D$) are devoid of a configuration signal, and terminal 37 is connected to receive control signal, $V_{CC}$/2. TTL termination for receiver circuit 34 requires configuration pin 42 ($V_C$) and configuration pin 44 ($V_D$) are devoid of a configuration signal, and terminal 37 is connected to receive control signal, 1.5 volts. Termination of the configuration pins 42, 44 is done external to receiver package 32.

FIG. 3 illustrates an embodiment of a driver circuit and a receiver circuit system used in a modified single-ended configuration. The single-ended configuration receives a logic input signal at driver circuit 50. Driver circuit 50 is a device from a typical type of logic family, e.g. ECL, CML, LVDS, CMOS, and TTL, or can be an analog driver circuit. Driver circuit 50 provides a signal boost for the logic input signal. Receiver package 52 receives a drive signal on line 56 from driver circuit 50. Receiver package 52 is a semiconductor package for receiver circuit 54. $V_{CC}$ and $V_{EE}$ are power supply potentials to receiver package 52 providing power to receiver circuit 54. Receiver circuit 54 is terminated with load element 58 which is connected to configuration pin 60. Load element 58 is a resistor contained within receiver package 52 having a resistance of 50, 75, or 100 ohms. Configuration pin 60 is an external pin connected to receiver package 52 that is programmable so receiver circuit 54 can communicate with different logic family drivers. Configuration pin 60 is programmed by terminating the pin using a configuration which is dependent on the desired logic family application. The configuration of receiver circuit 54 is controlled by connecting configuration pin 60 ($V_E$) as follows.

| ECL: | $V_E$ = $V_{CC}$ - 2 |
| --- | --- |
| CML: | $V_E$ = $V_{CC}$ |
| LVDS: | $V_E$ = open |

To terminate receiver circuit 54 for an ECL application requires that configuration pin 60 ($V_E$) is connected to receive configuration signal, $V_{CC}$-2. For a CML application, receiver circuit 54 is terminated with configuration pin 60 ($V_E$) connected to receive configuration signal, $V_{CC}$. LVDS termination for receiver circuit 54 requires that configuration pin 60 ($V_E$) be left open. Termination of the configuration pin 60 is done external to receiver package 52.

FIG. 4 illustrates a differential configuration similar to FIG. 1, except termination is done on driver package 70. Driver circuit 72 is terminated at load element 74 and load element 76. Load element 74, 76 are resistors contained within driver package 70 having a value of 50, 75, or 100 ohms. Configuration pin 78 and configuration pin 80 are configured similar to table shown for the differential configuration in FIG. 1. Driver circuit 72 provides an output signal on differential line 82 to receiver circuit 84.

FIG. 5 illustrates a detailed schematic of the differential configuration in FIG. 1. Semiconductor package 90 houses a leadframe 92 with metal leads similar to lead 94 which provide input and output signals. The input and output signals consist of differential input logic signals $IN_1$, and $IN_2$, differential output logic signals $OUT_1$, and $OUT_2$, power supply signals $V_{CC}$ and $V_{EE}$, and configuration signals $V_A$ and $V_B$ on configuration pins 97, 99 respectfully. Semiconductor die 96 is attached to flag 98 which is attached to leadframe 92. Bond wire 100 is attached to bond pad 102 on semiconductor die 96 to provide electrical contact to bond pad 104 for the $V_{EE}$ signal. All other input and output signals have the same bond wire configuration to provide electrical contact. The wire bonding technology used is typically a bump type technology or a ball grid array (BGA) technology. The differential configuration typically has differential amplifier 106 for receiver circuit 16 of FIG. 1. Load elements 108, 110 are connected to bond pads 112, 114 respectfully to provide an electrical connection to configuration signals $V_B$ and $V_A$. The differential signal from logic circuit 10 of FIG. 1 is received at lead 119 ($IN_1$) and lead 117 ($IN_2$) which has electrical contact to bond pads 118, 116 on semiconductor die 96, and to differential amplifier 106. The logic output signal from receiver circuit 16 of FIG. 1 is coupled from differential amplifier 106, electrical contact is made to bond pads 120, 122 on semiconductor die 96, and the signals are coupled to leads 121. ($OUT_1$) and 94 ($OUT_2$) respectfully. Power supply is received at leads 125 ($V_{CC}$) and 126 ($V_{EE}$) making electrical contact to differential amplifier 106 through bond pads 124, 102 respectively.

An alternative method to provide termination to any of the above embodiments is to use a switch between the termination (load) elements and the (configuration) termination signals. For example, FIG. 1 has external (configuration) termination pins 22, 24 which are configured to receive different termination signals depending on the logic family application. A switch can be used to programmably connect termination pins 22, 24 to $V_{CC}$-2 for an ECL logic family application, or to $V_{CC}$ for a CML logic family application. The switch can provide programmability for the termination signals to any of the previous configurations outlined herein.

Thus, a technique for generating multiple input termination options on a single integrated circuit is disclosed. A receiver circuit is programmable to configure different termination connections which allow the receiver circuit to communicate with a driver circuit from a different logic family. The receiver circuit has at least one external configuration pin that is configured to provide the necessary termination for the type of logic family driver circuit used. The configuration pin is external to a semiconductor package housing the receiver circuit. Having configuration pins external to the semiconductor package provides for easy portability among different logic families, and easy termination options which require no additional translators to operate a mixed logic family system.

What is claimed is:

1. An integrated logic circuit having a differential input receiving a differential signal, comprising:
   a receiver having first and second inputs coupled for receiving the differential signal;
   a semiconductor package for housing the receiver, having first and second pins respectively coupled to the first and second inputs of the receiver, and a supply pin coupled to the receiver for providing a power supply potential;
   a first termination element housed in the semiconductor package and coupled between the first input of the receiver and a first programmable configuration pin of the semiconductor package; and
   a second termination element housed in the semiconductor package and coupled between the second input of the receiver and a second programmable configuration pin of the semiconductor package, wherein the first and second programmable configuration pins receive first and second termination signals to configure termination for the logic circuit.

2. The integrated logic circuit of claim 1, wherein the first and second termination elements comprise resistors.

3. A method of configuring a receiver circuit using first and second configuration signals, and receiving first and second input signals to the receiver circuit, comprising:
   coupling an information signal on the first input to the receiver circuit;
   coupling a control signal on the second input to the receiver circuit;
   providing a first programmable configuration pin of a semiconductor package housing the receiver circuit;
   connecting a first load element between the first input of the receiver circuit and the first programmable configuration pin;
   providing a second programmable configuration pin of a semiconductor package housing the receiver circuit; and
   connecting a second load element between the second input of the receiver circuit and the second programmable configuration pin.

4. The method of claim 3, wherein the first and second programmable configuration pins receive a configuration selected from the group consisting of the first configuration signal, the second configuration signal, and devoid of the first and second configuration signals.

5. The method of claim 3, wherein the second input receives a control signal selected from the group consisting of a first control signal, a second control signal, and a third control signal.

6. An integrated circuit, comprising:
   a semiconductor package having first and second pins respectively adapted for receiving first and second data signals, third and fourth pins for respectively receiving first and second termination signals, and a supply pin coupled for receiving a power supply voltage; and
   a semiconductor die housed in the semiconductor package for operating from the power supply voltage, and having a first load element coupled between the first and third pins to terminate the first data signal, and a second load element coupled between the second and fourth pins to terminate the second data signal.

7. The integrated circuit of claims 6, wherein the first and second load elements are resistors.

8. The integrated circuit of claim 6, wherein the semiconductor die includes a receiver circuit having first and second inputs coupled to the first and second pins, respectively.

9. The integrated circuit of claim 6, wherein the semiconductor die includes a driver circuit having first and second outputs coupled to the first and second pins, respectively.

10. The integrated circuit of claim 6, wherein the first data signal is from a first logic family, and the third pin is coupled for receiving a first termination voltage characteristic of the first logic family.

11. The integrated circuit of claim 10, wherein the second data signal is from a second logic family, and the fourth pin receives a second termination voltage of the second logic family.

12. A method of operating an integrated circuit, comprising the steps of:
   applying first and second logic signals to first and second pins, respectively, of a semiconductor package of the integrated circuit; and
   loading the first and second logic signals with first and second load elements, respectively, of the integrated circuit, where the first and second load elements are coupled to third and fourth pins of the semiconductor package to provide a programmable termination for the first and second logic signals.

13. The method of claim 12, wherein the first and second logic signals function as a differential signal and the third and fourth pins are for coupling together to terminate the differential signal.

14. The method of claim 12, wherein the first and second logic signals are specified in accordance with first and second logic families and the third and fourth pins are coupled to first and second configuration signals of the first and second logic families, respectively.

15. The method of claims 14, wherein the first and second logic signals are ECL signals referenced to a supply voltage, and the first and second configuration signals have values equal to the supply voltage minus about two volts.

16. The integrated logic circuit of claim 12, further comprising the step of applying a power supply voltage to a fifth pin of the semiconductor package to bias the integrated circuit.

* * * * *

UNITED STATES PATENT AND TRADEMARK OFFICE
CERTIFICATE OF CORRECTION

PATENT NO. : 6,362,644 B1
DATED : March 26, 2002
INVENTOR(S) : Philip A. Jeffery and Stephen G. Shook It is certified that error appears in the above-identified patent and that said Letters Patent is hereby corrected as shown below:

Column 6,
Line 53, please change "The intergrated logic circuit of" to -- The method of --.

Signed and Sealed this

Third Day of May, 2005

JON W. DUDAS
*Director of the United States Patent and Trademark Office*